United States Patent
Jang et al.

(10) Patent No.: US 8,940,368 B2
(45) Date of Patent: Jan. 27, 2015

(54) VAPOR DEPOSITION APPARATUS AND VAPOR DEPOSITION METHOD

(75) Inventors: Choel-Min Jang, Yongin (KR); Myung-Soo Huh, Yongin (KR); Jeong-Ho Yi, Yongin (KR); Cheol-Rae Jo, Yongin (KR); Sang-Joon Seo, Yongin (KR); Seung-Hun Kim, Yongin (KR); Jin-Kwang Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 82 days.

(21) Appl. No.: 13/530,924

(22) Filed: Jun. 22, 2012

(65) Prior Publication Data

US 2013/0189433 A1 Jul. 25, 2013

(30) Foreign Application Priority Data

Jan. 19, 2012 (KR) .......................... 10-2012-0006409

(51) Int. Cl.
*C23C 16/458* (2006.01)
*C23C 16/455* (2006.01)

(52) U.S. Cl.
USPC ....................................... 427/248.1; 118/715

(58) Field of Classification Search
None
See application file for complete search history.

(56) References Cited

U.S. PATENT DOCUMENTS

| 5,079,481 A * | 1/1992 | Moslehi .................. 315/111.41 |
| 2002/0104205 A1* | 8/2002 | Goodwin ..................... 29/25.01 |
| 2003/0209200 A1* | 11/2003 | Kuznetsov et al. ........... 118/724 |
| 2007/0125303 A1* | 6/2007 | Ruby et al. ..................... 118/724 |
| 2009/0291209 A1 | 11/2009 | Granneman et al. |
| 2011/0165320 A1 | 7/2011 | Choi et al. |

FOREIGN PATENT DOCUMENTS

| KR | 10-2007-0014276 | 2/2007 |
| KR | 10-2009-0058931 | 6/2009 |
| KR | 10-2011-0049650 | 5/2011 |
| KR | 10-2011-0072146 | 6/2011 |
| KR | 10-2011-0074044 | 6/2011 |
| KR | 10-2011-0080586 | 7/2011 |

OTHER PUBLICATIONS

Defintion of "adjacent". FreeDictionary Online, downloaded Dec. 2013.*

* cited by examiner

*Primary Examiner* — Joseph Miller, Jr.
(74) *Attorney, Agent, or Firm* — Robert E. Bushnell, Esq.

(57) ABSTRACT

A vapor deposition apparatus includes a stage on which a substrate is mounted; a heater unit that is disposed at a side of the stage and includes a first heater and a second heater, wherein the first heater and the second heater are movable so that the first heater and the second heater are spaced apart from each other or are disposed adjacent to each other; and a nozzle unit that is disposed at a side opposite to the side at which the heater unit is disposed about the stage and includes one or more nozzles.

12 Claims, 3 Drawing Sheets

VAPOR DEPOSITION APPARATUS AND VAPOR DEPOSITION METHOD

CLAIM OF PRIORITY his application makes reference to, incorporates the same herein, and claims all benefits accruing under 35 U.S.C. §119 from an application earlier filed in the Korean Intellectual Property Office on 19 Jan. 2012 and there duly assigned Serial No. 10-2012-0006409.

BACKGROUND OF THE INVENTION

1. Field of the Invention

The present invention relates to a vapor deposition apparatus and a vapor deposition method.

2. Description of the Related Art

A semiconductor device, a display device, and other electronic devices include a plurality of thin films. In order to form such a thin film to a predetermined thickness, a vapor deposition method using at least one gas including a thin film raw material is performed.

Examples of a vapor deposition method include chemical vapor deposition (CVD) using a chemical reaction and atomic layer deposition (ALD) for uniformly forming a fine thin film having a thickness of one atomic layer at a temperature lower than that of CVD.

Since CVD and ALD use a chemical reaction between gas molecules, the temperature of a chamber in which deposition occurs or the temperature of a substrate on which deposition occurs needs to be maintained above a predetermined temperature.

Also, when a foreign substance is generated while a thin film is deposited on a substrate during vapor deposition, characteristics of the thin film may be degraded.

SUMMARY OF THE INVENTION

The present invention provides a vapor deposition apparatus and a vapor deposition method which improve the characteristics of a thin film to be deposited by preventing a foreign substance from adhering to a substrate during deposition.

The present invention also provides a vapor deposition apparatus and a vapor deposition method which improve the characteristics of a thin film to be deposited by maintaining a substrate at a constant temperature.

The present invention also provides a vapor deposition apparatus and a vapor deposition method which improve the efficiency of the process.

According to an aspect of the present invention, there is provided a vapor deposition apparatus including: a stage on which a substrate is mounted; a heater unit disposed at a side of the stage and including a first heater and a second heater, wherein the first heater and the second heater are movable such that the first heater and the second heater are spaced apart from each other or disposed adjacent to each other; and a nozzle unit disposed at a side opposite to the side at which the heater unit is disposed about the stage, and including one or more nozzles.

The stage may be disposed so that a surface of the stage on which the substrate is mounted faces the ground, the nozzle unit may be disposed under the stage, and the heater unit may be disposed over the stage.

The stage may be disposed so that a surface of the stage on which the substrate is mounted is disposed parallel to a direction in which gravity acts.

The vapor deposition apparatus may further include an aligner that mounts the substrate on the stage.

The vapor deposition apparatus may further include a stage driving unit that drives the stage so that the stage on which the substrate is mounted moves.

The stage driving unit may be disposed under the stage.

The heater unit may move along with the stage when the stage moves.

The vapor deposition apparatus may further include: a stage support portion that supports the stage and moves due to the stage driving unit; a heater support portion that supports the heater unit; and a heater driving unit that drives the heater unit; wherein the heater support portion and the heater driving unit are disposed on the stage support unit, and move along with the stage support portion due to the stage driving unit.

The stage on which the substrate is mounted may reciprocate so as to repeatedly cross the nozzle unit.

The vapor deposition apparatus may further include a nozzle unit driving unit that drives the nozzle unit so that the nozzle unit moves.

The vapor deposition apparatus may further include a chamber in which the stage is disposed and which is maintained at a constant pressure.

The nozzle unit may include a plurality of nozzles through which a source gas and a reactant gas are sprayed.

According to another aspect of the present invention, there is provided a vapor deposition method including the steps of: disposing a heater unit, including a first heater and a second heater spaced apart from each other, at a side of a stage; mounting a substrate on the stage; moving the first heater and the second heater so that the first heater and the second heater are disposed adjacent to each other; and injecting a gas through a nozzle unit disposed at a side opposite to the side at which the heater unit is disposed about the stage and including one or more nozzles.

The stage may be disposed so that a surface of the stage on which the substrate is mounted faces the ground, the nozzle unit may be disposed under the stage, and the heater unit may be disposed over the stage.

The stage may be disposed parallel to a direction in which gravity acts.

The mounting of the substrate on the stage may include mounting the substrate on the stage by using an aligner.

The moving of the first heater and the second heater may include moving the first heater and the second heater so that the first heater and the second heater are disposed so as to correspond to the substrate.

The vapor deposition method may further include moving the stage on which the substrate is mounted by using a stage driving unit.

The heater unit may move along with the stage when the stage moves.

A stage support portion that supports the stage and moves due to the stage driving unit, a heater support portion that supports the heater unit, and a heater driving unit that drives the heater unit may be further provided. The heater support portion and the heater driving unit may be disposed on the stage support portion and may move along with the stage support portion due to the stage driving unit.

The moving of the stage may include reciprocating the stage on which the substrate is mounted so that the stage repeatedly crosses the nozzle unit.

The vapor deposition method may further include moving the nozzle unit by using a nozzle driving unit.

The vapor deposition method may further include disposing the stage in a chamber that is maintained at a constant pressure.

The nozzle unit may include a plurality of nozzles through which a source gas and a reactant gas are sprayed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

As used herein, the term "and/or" includes any and all combinations of one or more of the associated listed items.

The present invention will now be described more fully with reference to the accompanying drawings, in which exemplary embodiments of the invention are shown.

Figure 1:
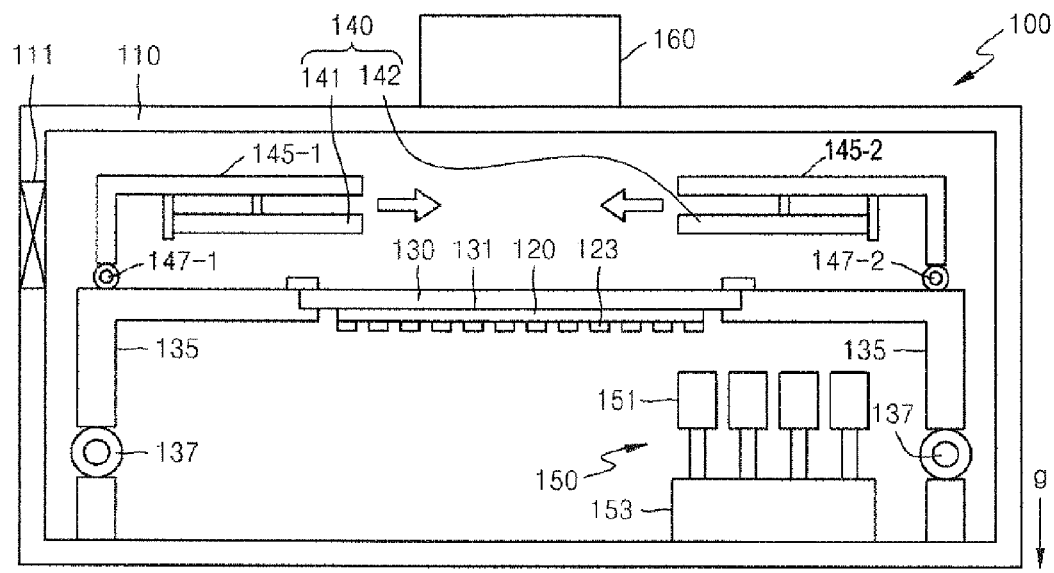
FIG. 1 is a cross-sectional view illustrating a state wherein a first heater unit and a second heater are spaced apart from each other in a vapor deposition apparatus according to an embodiment of the present invention.
Figure 2:
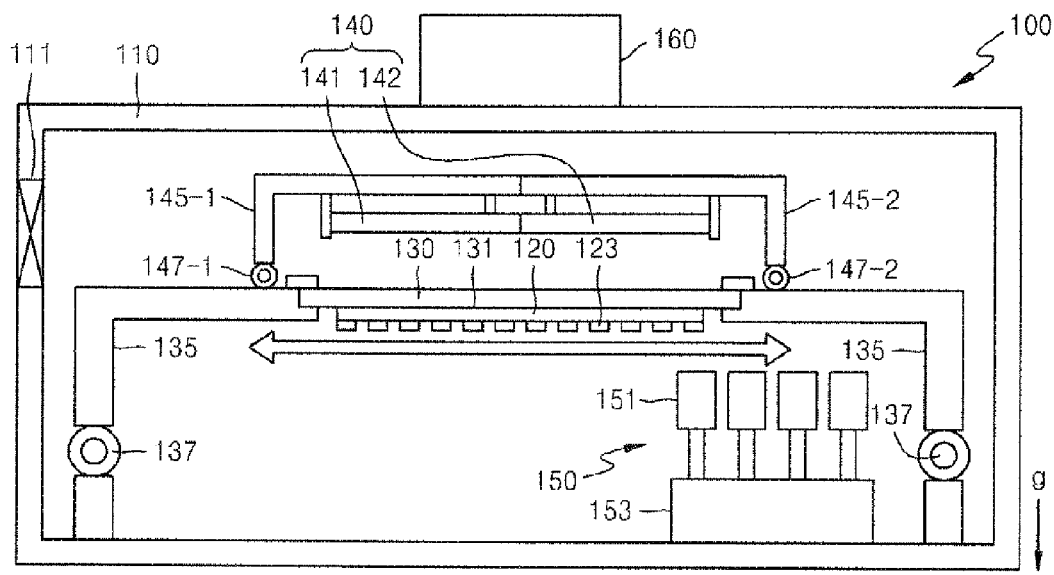
FIG. 2 is a cross-sectional view illustrating a state wherein the first heater and the second heater are disposed adjacent to each other in the vapor deposition apparatus of FIG. 1.

FIG. 1 is a cross-sectional view illustrating a state wherein a first heater and a second heater are spaced apart from each other in a vapor deposition apparatus according to an embodiment of the present invention, and FIG. 2 is a cross-sectional view illustrating a state wherein the first heater and the second heater are disposed adjacent to each other in the vapor deposition apparatus of FIG. 1.

Referring to FIGS. 1 and 2, the vapor deposition apparatus 100 includes: a stage 130 that supports a substrate 120; a heater unit 140 that is disposed at a side of the stage 130 and includes the first heater 141 and the second heater 142, wherein the first heater 141 and the second heater 142 are movable so that the first heater 141 and the second heater 142 are spaced apart from each other or disposed adjacent to each other; and a nozzle unit 150 that is disposed at a side opposite to the side at which the heater unit 140 is disposed about the stage 130, and which includes one or more nozzles 151.

The stage 130 is disposed so that a first surface 131 on which the substrate 120 is disposed faces the ground, the nozzle unit 150 is disposed under the stage 130, and the heater unit 140 is disposed over the stage 130. In this regard, the term "under" means below something located in a direction g in which gravity acts and the term "over" means above something located in a direction opposite to the direction in which gravity acts.

The substrate 120 is disposed on the first surface 131 of the stage 130. The substrate 120 may be a substrate formed of glass or the like which may be applied to a display device such as an organic light-emitting device (OLED) or a liquid crystal display (LCD) device, or substrate 120 may be a semiconductor substrate.

The substrate 120 may be mounted on the stage 130 by using a clamp, a pressure unit, an adhesive material, or the like. A mask 123, including an opening corresponding to a desired deposition position on the substrate 120, may be disposed on a surface of the substrate 120 on which a thin film is to be deposited.

The stage 130 may be disposed in a chamber 110. The chamber 110 includes a vent hole 111 through which a gas may be discharged outward, and is maintained at a predetermined pressure due to a pump (not shown).

The nozzle unit 150 disposed under the stage 130 may include the plurality of nozzles 151 and a nozzle support portion 153. Each of the nozzles 151 may allow a source gas, including a thin film raw material, a reactant gas, or a purge gas for removing an unnecessary gas, to be injected therethrough to the substrate 120.

Although four nozzles 151 are illustrated in FIG. 1, the present embodiment is not limited thereto and three or less, or five or more, nozzles 151 may be provided.

When the stage 130 on which the substrate 120 is mounted crosses the nozzle unit 150 one time, a thin film having a very small thickness of about several nm is formed according to a material for forming the thin film. Accordingly, in order to form a thin film having a predetermined thickness on the substrate 120, the stage 130 that supports the substrate 120 reciprocates so as to repeatedly cross the nozzle unit 150.

The vapor deposition apparatus 100 includes a stage driving unit 137 that drives the stage 130 so that the stage 130 on which the substrate 120 is mounted moves in a direction in which the plurality of nozzles 151 are arranged.

The stage 130 is supported by a stage support portion 135, and the stage 130 and the stage support portion 135 may reciprocate due to the stage driving unit 137.

The stage driving unit 137 may include a linear guide (not shown), a servo motor (not shown), and a position sensor (not shown). The stage support portion 135 moves along the linear guide, and repeatedly alternates its direction at a direction alternation time when the direction needs to change, which is determined by the position sensor.

The stage driving unit 137 may be disposed under the stage 130. In order to prevent a foreign substance from being generated while the stage 130 is driven, a blocking unit (not shown) may be disposed around the linear guide of the stage driving unit 137. In this configuration, a foreign substance generated on the stage driving unit 137 may be prevented from adhering to a thin film formed on the substrate 120.

However, the stage driving unit 137 is not limited thereto, and the stage 130 may reciprocate due to any of various other moving units.

As the stage 130 reciprocates so as to repeatedly cross the nozzle unit 150, a thin film is deposited on the substrate 120 mounted on the stage 130. As the number of times the stage 130 reciprocates increases, the thickness of the thin film deposited on the substrate 120 increases.

That is, a thin film having a desired thickness may be deposited on the substrate 120 by controlling the number of times the stage 130 reciprocates.

The heater unit 140, including the first heater 141 and the second heater 142, is disposed over the stage 130, and an aligner 160 that may mount and align the substrate 120 on the stage 130 is disposed over the heater unit 140.

The first heater 141 and the second heater 142 may move so that the first heater 141 and the second heater 142 are spaced apart from each other or disposed adjacent to each other. FIG.

1 illustrates a state where the first heater 141 and the second heater 142 are spaced apart from each other. FIG. 2 illustrates a state where the first heater 141 and the second heater 142 are disposed adjacent to each other.

When the first heater 141 and the second heater 142 are spaced apart from each other, the aligner 160 mounts and aligns the substrate 120. After the substrate 120 is completely aligned, the first heater 141 and the second heater 142 move in directions indicated by arrows in FIG. 1 so as to be disposed adjacent to each other as shown in FIG. 2.

When the first heater 141 and the second heater 142 are disposed adjacent to each other, the first heater 141 and the second heater 142 are disposed so as to correspond to the stage 130, on which the substrate 120 is mounted, and the first heater 141 and the second heater 142 heat the substrate 120 so as to maintain a temperature suitable for a deposition condition.

The first heater 141 and the second heater 142 include heater support portions 145-1 and 145-2, respectively, that support the first heater 141 and the second heater 142, and heater driving units 147-1 and 147-2, respectively, that drive the first heater 141 and the second heater 142, respectively. The heater support portions 145-1 and 145-2 and the heater driving units 147-1 and 147-2 may be disposed on the stage support portion 135.

Each of the heater driving units 147-1 and 147-2 may include a linear guide (not shown) and a servo motor (not shown).

That is, the first heater 141 and the second heater 142 may move on the stage support portion 135 so that the first heater 141 and the second heater 142 are spaced apart from each other or are disposed adjacent to each other due to the heater driving units 147-1 and 147-2. While a thin film is deposited on the substrate 120, the first heater 141 and the second heater 142 may reciprocate along with the stage 130 and the stage support portion 135 due to the stage driving unit 137.

Since the heater unit 140 moves along with the stage 130 on which the substrate 120 is mounted, the substrate 120 may be maintained at a constant temperature while a thin film is deposited on the substrate 120.

A vapor deposition method using the vapor deposition apparatus 100 of FIG. 1 will be explained briefly.

The heater unit 140, including the first heater 141 and the second heater 142, is disposed at a side of the stage 130 disposed in the chamber 110. When the first heater 141 and the second heater 142 are spaced apart from each other, the substrate 120 is mounted on the stage 130 by using the aligner 160.

The mask 123 may be disposed on a surface of the substrate 120 on which a thin film is to be deposited.

After the substrate 120 is completely mounted on the stage 130, the first heater 141 and the second heater 142 move so as to be disposed adjacent to each other, that is, so as to be disposed in correspondence to the substrate 120.

When the substrate 120 is heated by the first heater 141 and the second heater 142 to a temperature suitable for a desired deposition condition, the stage 130 on which the substrate 120 is mounted and the stage support portion 135 that supports the stage 130 move due to the stage driving unit 137 so as to cross the nozzle unit 150 which is disposed at a side opposite to the side at which the heater unit 140 is disposed about the stage 130.

Since the heater unit 140 and the heater support portions 145-1 and 145-2 that support the heater unit 140 are disposed on the stage support portion 135, the heater unit 140 continuously heats the substrate 120 while moving along with the stage 130 so that the substrate 120 is not cooled and is maintained at a constant temperature.

The nozzle unit 150 may include four nozzles 151 which allow a source gas, a purge gas, a reactant gas, or a purge gas to be sprayed therethrough sequentially beginning from a leftmost nozzle.

For example, the source gas may be an aluminum (Al) gas and the purge gas may be an argon (Ar) gas. A single atomic layer or multiple atomic layers formed of Al are formed on the substrate 120 by injecting a source gas and then a purge gas. Next, an aluminum oxide ($Al_xO_y$) film may be formed on the substrate 120 by injecting a reactant gas including oxygen (O) atoms and then a purge gas.

However, the present embodiment is not limited thereto, and various other oxide films, organic films, inorganic films, insulating films, and conductive films may be formed on the substrate 120 by using the vapor deposition apparatus 100.

As the stage 130 reciprocates in a direction indicated by an arrow in FIG. 2, a thin film having a predetermined thickness may be formed on the substrate 120 by repeatedly performing the vapor deposition method.

According to the vapor deposition apparatus 100 of FIG. 1, since the nozzle unit 150 and the stage driving unit 137 are disposed under the substrate 120, a foreign substance may be prevented from adhering to the substrate 120 during deposition. Since the stage 130 that supports the substrate 120 and the heater unit 140 move together due to the stage driving unit 137, the substrate 120 may be maintained at a constant temperature, and the characteristics of a thin film to be deposited may be improved.

Figure 3:
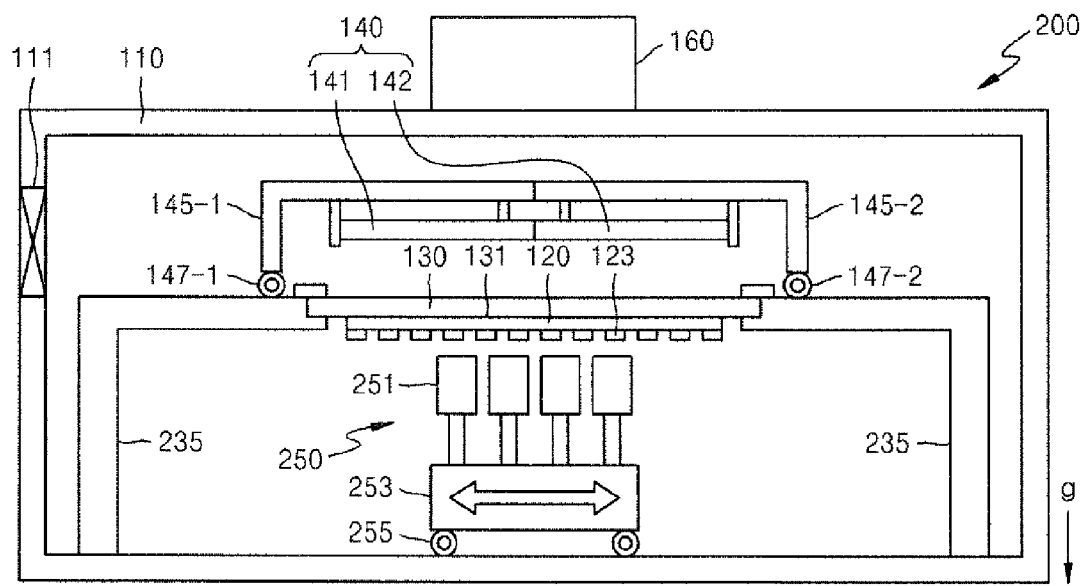
FIG. 3 is a cross-sectional view illustrating a vapor deposition apparatus according to another embodiment of the present invention.

FIG. 3 is a cross-sectional view illustrating a vapor deposition apparatus according to another embodiment of the present invention.

The vapor deposition apparatus 200 of FIG. 3 is the same as the vapor deposition apparatus 100 of FIG. 1 except that a nozzle driving unit 255, instead of the stage driving unit 137 of FIG. 1, is provided.

Referring to FIG. 3, when a thin film is formed on the substrate 120 mounted on the stage 130, the stage 130 and a stage support portion 235 do not move, and a thin film having a predetermined thickness is deposited on the substrate 120 as a nozzle unit 250 reciprocates under the substrate 120.

The nozzle unit 250 may include a plurality of nozzles 251, a nozzle support portion 253 that supports the nozzles 251, and the nozzle driving unit 255.

Since other elements are the same as those of the vapor deposition apparatus 100 of FIG. 1, a description of the vapor deposition apparatus 100 may apply to the vapor deposition apparatus 200 of FIG. 2.

Figure 4:
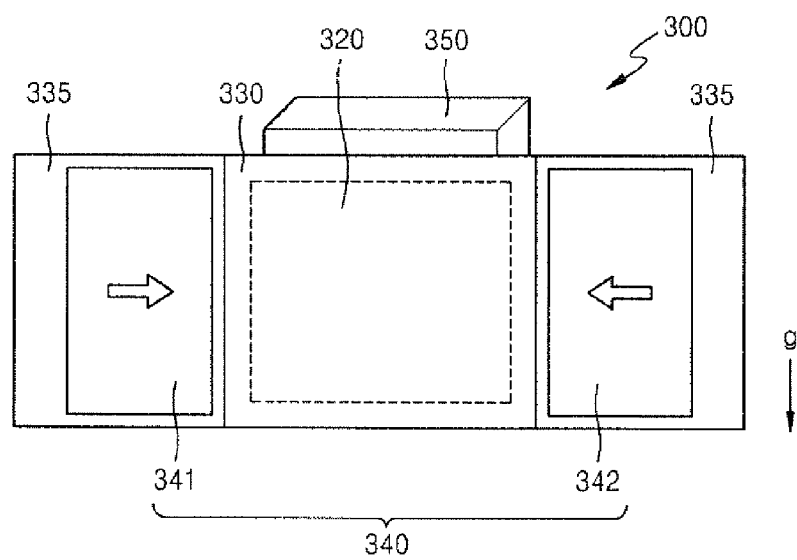
FIG. 4 is a perspective view illustrating a state wherein a first heater and a second heater are spaced apart from each other in a vapor deposition apparatus according to another embodiment of the present invention.
Figure 5:
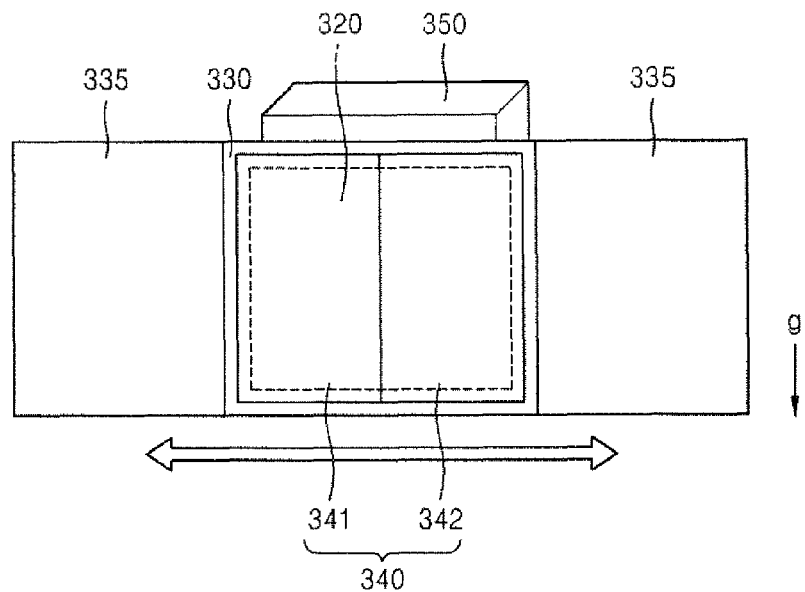
FIG. 5 is a perspective view illustrating a state wherein the first heater and the second heater are disposed adjacent to each other in the vapor deposition apparatus of FIG. 4.

FIG. 4 is a perspective view illustrating a state wherein a first heater and a second heater are spaced apart from each other in a vapor deposition apparatus according to another embodiment of the present invention, and FIG. 5 is a perspective view illustrating a state wherein the first heater and the second heater are disposed adjacent to each other in the vapor deposition apparatus of FIG. 4.

Referring to FIGS. 4 and 5, the vapor deposition apparatus 300 of FIG. 4 includes: a stage 330 that supports a substrate 320; a heater unit 340 that is disposed at a side of the stage 330 and includes the first heater 341 and the second heater 342, wherein the first heater 341 and the second heater 342 are movable so that the first heater 341 and the second heater 342 are spaced apart from each other or are disposed adjacent to each other; and a nozzle unit 350 that is disposed at a side opposite to the side at which the heater unit 340 is disposed about the stage 330, and includes one or more nozzles (not shown).

The stage 330 is disposed so that a surface of the stage 330 on which the substrate 320 is mounted is disposed parallel to a direction g in which gravity acts.

The substrate 320 is disposed on the stage 330. The substrate 320 may be a substrate formed of glass or the like which may be applied to a display device such as an OLED or an LCD device, or the substrate 320 may be a semiconductor substrate.

The substrate 320 may be mounted on the stage 330 by using a clamp, a pressure unit, an adhesive material, or the like.

The nozzle unit 350 may include a plurality of nozzles (not shown). Each of the nozzles may allow a source gas, including a thin film raw material, a reactant gas, or a purge gas for removing an unnecessary gas, to be injected therethrough to the substrate 320.

When the stage 330 on which the substrate 320 is mounted crosses the nozzle unit 350 one time, a thin film having a very small thickness of about several nm is formed according to a material for forming the thin film. Accordingly, in order to form a thin film having a predetermined thickness on the substrate 320, the stage 330 that supports the substrate 320 reciprocates so as to repeatedly cross the nozzle unit 350.

In FIG. 4, the stage 330 on which the substrate 320 is mounted and a stage support portion 335 that supports the stage 330 reciprocate in a direction indicated by an arrow in FIG. 5 due to a stage driving unit (not shown). However, the present embodiment is not limited thereto, and the stage 330 may not move and the nozzle unit 350 may reciprocate so as to repeatedly cross the substrate 320 due to a nozzle unit driving unit (not shown).

The heater unit 340 including the first heater 341 and the second heater 342 is disposed at a side opposite to the side at which the nozzle unit 350 is disposed about the stage 330.

The first heater 341 and the second heater 342 may move so that the first heater 341 and the second heater 342 are spaced apart from each other or are disposed adjacent to each other. FIG. 4 illustrates a state where the first heater 341 and the second heater 342 are spaced apart from each other. FIG. 5 illustrates a state where the first heater 341 and the second heater 342 are disposed adjacent to each other.

When the first heater 341 and the second heater 342 are spaced apart from each other, an aligner (not shown) mounts and aligns the substrate 320. After the substrate 320 is completely aligned, the first heater 341 and the second heater 342 move in a direction indicated by an arrow in FIG. 4 so as to be disposed adjacent to each other as shown in FIG. 5.

When the first heater 341 and the second heater 342 are disposed adjacent to each other, the first heater 341 and the second heater 342 are disposed so as to correspond to the stage 330, that is, the substrate 320 mounted on the stage 330, and the first heater 341 and the second heater 342 heat the substrate 320 to a temperature suitable for a deposition condition.

The first heater 341 and the second heater 342 may move along with the stage 330 due to the stage driving unit, and thus may continuously heat the substrate 320 so as to maintain the substrate 320 at a temperature suitable for deposition while a thin film is deposited on the substrate 320.

According to the vapor deposition apparatus 300 of FIG. 4, since the stage 330 is disposed parallel to the direction g in which gravity acts, when a gas is supplied from the nozzle unit 350 and a thin film is deposited on the substrate 320, an unnecessary gas, an unnecessary gas aggregation and a foreign substance may drop downward from the substrate 320 due to gravity, and thus the characteristics of the thin film may be improved.

Since a gas dropping from the substrate 320 may be discharged to the outside during an exhaust process through a vent hole (not shown), a purging process may be omitted.

Figure 6:
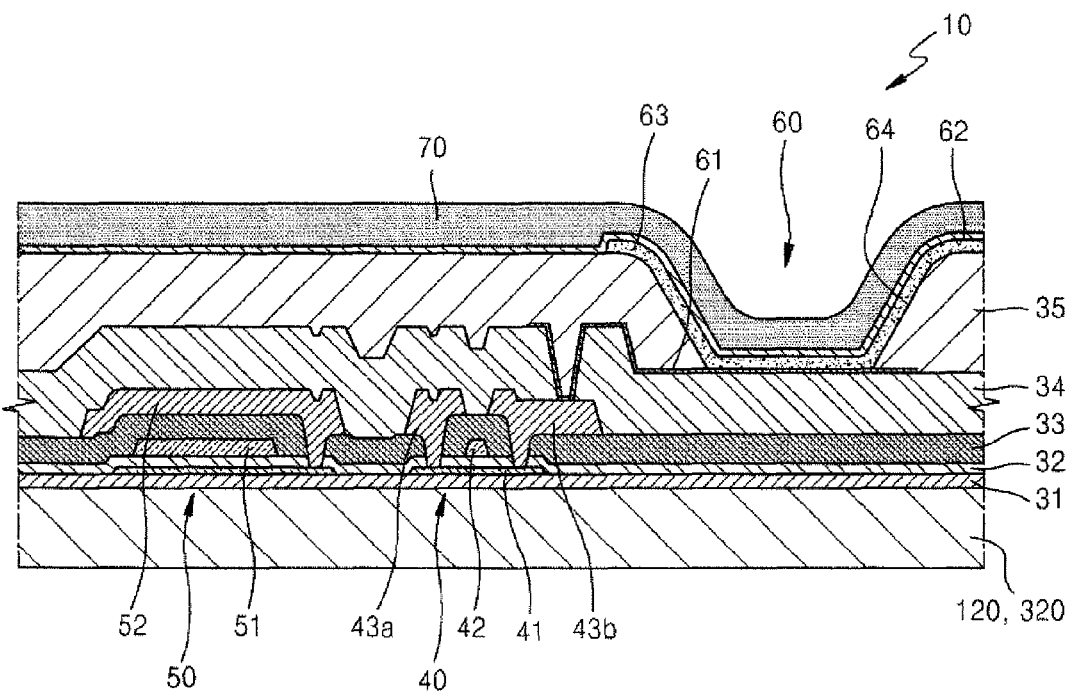
FIG. 6 is a cross-sectional view illustrating an organic light-emitting display device manufactured by using the vapor deposition apparatus of FIG. 1, 3 or 4.

FIG. 6 is a cross-sectional view illustrating an organic light-emitting display device manufactured by using the vapor deposition apparatus of FIG. 1, 3 or 4.

Referring to FIG. 6, the organic light-emitting display device 10 includes a thin film transistor (TFT) 40, a capacitor 50, and an organic light-emitting element 60 which are disposed on the substrate 120 of FIG. 1 or 3 or 320 of FIG. 4.

The substrate 120 or 320 may be formed of glass, plastic, or metal. A buffer layer 31 that planarizes the substrate 120 or 320 and prevents moisture or a foreign substance from penetrating into the TFT 40 or the like from the substrate 120 or 320 is disposed on the substrate 120 or 320.

The TFT 40 includes an active layer 41, a gate electrode 42, a source electrode 43a, and a drain electrode 43b. The capacitor 50 includes a lower electrode 51 and an upper electrode 52.

The organic light-emitting element 60 includes a pixel electrode 61, a counter electrode 62, and an organic light-emitting layer 63 disposed between the pixel electrode 61 and the counter electrode 62.

In detail, the active layer 41, including a semiconductor material into which a p-type or an n-type dopant is implanted, and the gate electrode 42 are formed on the buffer layer 31, and a gate insulating film 32 is disposed between the active layer 41 and the gate electrode 42. The gate insulating film 32 is disposed between the lower electrode 51 and the upper electrode 52 of the capacitor 50 and functions as a dielectric layer of the capacitor 50.

An interlayer insulating film 33 is disposed on the gate electrode 42, and the source electrode 43a and the drain electrode 43b, which respectively contact predetermined regions of the active layer 41, are disposed on the interlayer insulating film 33.

A passivation layer 34 is disposed on the source electrode 43a and the drain electrode 43b, and the pixel electrode 61 is disposed on the passivation layer 34. The pixel electrode 61 is electrically connected to any one of the source electrode 43a and the drain electrode 43b.

A pixel defining film 35 is formed so as to cover both edges of the pixel electrode 61. The pixel defining film 35 includes an opening 64 that defines a pixel region.

The organic light-emitting layer 63 and the counter electrode 62 are disposed in the pixel region defined by the opening 64.

The counter electrode 62 is disposed over an entire surface of the substrate 120 or 320, and functions as a common electrode. An encapsulation layer 70, including an organic material and/or an inorganic material, is disposed on the counter electrode 62.

The encapsulation layer 70 may be formed by using the vapor deposition apparatus 100, 200, or 300. That is, the encapsulation layer 70 may be formed by performing the vapor deposition method as described above after mounting the substrate 120 or 320, on which the TFT 40, the capacitor 50 and the organic light-emitting element 60 are formed, on the stage 130 or 330 of the vapor deposition apparatus 100, 200, or 300.

However, the present embodiment is not limited thereto. That is, other insulating films, such as the buffer layer 31, the gate insulating film 32, the interlayer insulating film 33, the passivation layer 34, and the pixel defining film 35 of the organic light-emitting display device 10, may be formed by using the vapor deposition apparatus 100, 200, or 300.

Also, various thin films, such as the active layer 41, the gate electrode 42, the source electrode 43a, the drain electrode 43b, the pixel electrode 61, the organic light-emitting layer 63, and the counter electrode 62, may be formed by using the vapor deposition apparatus 100, 200, or 300.

As described above, according to the vapor deposition apparatus and the vapor deposition method of the one or more embodiments of the present invention, since a foreign substance is prevented from adhering to a substrate during deposition, characteristics of the thin film to be deposited may be improved.

Also, since a stage that supports a substrate and a heater unit move together, the substrate may be maintained at a constant temperature, and characteristics of the thin film to be deposited may be improved.

Also, since a heater unit is divided, a substrate may be easily mounted and aligned, and the efficiency of the process may be improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A vapor deposition method, comprising the steps of:
    disposing a heater unit, including a first heater and a second heater spaced apart from each other, at a side of a stage;
    moving the first heater and the second heater so that the first heater and the second heater are disposed adjacent to each other, after mounting a substrate on the stage; and
    depositing a thin film having a desired thickness on the substrate by injecting a gas through a nozzle unit, disposed at a side of the stage opposite to the side of the stage at which the heater unit is disposed, about the stage, the nozzle unit including at least one nozzle.

2. The vapor deposition method of claim 1, wherein the stage is disposed so that a surface of the stage on which the substrate is mounted faces the ground, the nozzle unit is disposed under the stage, and the heater unit is disposed over the stage.

3. The vapor deposition method of claim 1, wherein the stage is disposed so that a surface on which the substrate is mounted is parallel to a direction in which gravity acts.

4. The vapor deposition method of claim 1, wherein the step of mounting the substrate on the stage comprises using an aligner to mount the substrate on the stage.

5. The vapor deposition method of claim 1, wherein the step of moving the first heater and the second heater comprises moving the first heater and the second heater so that the first heater and the second heater are disposed in correspondence with the substrate.

6. The vapor deposition method of claim 1, further comprising the step of moving the stage on which the substrate is mounted by using a stage driving unit.

7. The vapor deposition method of claim 6, wherein the heater unit moves along with the stage when the stage moves.

8. The vapor deposition method of claim 7, further comprising the step of providing a stage support portion that supports the stage and moves due to the stage driving unit, a heater support portion that supports the heater unit, and a heater driving unit that drives the heater unit, wherein the heater support portion and the heater driving unit are disposed on the stage support portion and move along with the stage support portion due to the stage driving unit.

9. The vapor deposition method of claim 7, wherein the step of moving the stage comprises reciprocating the stage on which the substrate is mounted so that the stage repeatedly crosses the nozzle unit.

10. The vapor deposition method of claim 1, further comprising the step of moving the nozzle unit by using a nozzle driving unit.

11. The vapor deposition method of claim 1, wherein the substrate, the stage, the heater unit and the nozzle unit are disposed in a chamber, the method further comprising the step of maintaining the chamber at a constant pressure during vapor deposition.

12. The vapor deposition method of claim 1, wherein the nozzle unit comprises a plurality of the nozzles through which a source gas and a reactant gas are sprayed.

* * * * *